(12) United States Patent
Kurts et al.

(10) Patent No.: US 8,458,539 B2
(45) Date of Patent: Jun. 4, 2013

(54) G-ODLAT ON-DIE LOGIC ANALYZER TRIGGER WITH PARALLEL VECTOR FINITE STATE MACHINE

(75) Inventors: Tsvika Kurts, Haifa (IL); Daniel Skaba, Tel Aviv (IL); Michael Israeli, Tel Aviv (IL); Itai Samoelov, Mazor (IL); Julius Mandelblat, Haifa (IL)

(73) Assignee: Intel Corporation, Santa Clara, CA (US)

( * ) Notice: Subject to any disclaimer, the term of this patent is extended or adjusted under 35 U.S.C. 154(b) by 383 days.

(21) Appl. No.: 12/823,044

(22) Filed: Jun. 24, 2010

(65) Prior Publication Data
US 2011/0320893 A1 Dec. 29, 2011

(51) Int. Cl.
*G01R 31/28* (2006.01)
*G06F 11/00* (2006.01)
*H04B 3/46* (2006.01)
*H04B 17/00* (2006.01)
*H04Q 1/20* (2006.01)

(52) U.S. Cl.
USPC ............... 714/724; 714/25; 714/30; 714/39; 714/48; 714/732; 714/735; 714/738; 714/742; 370/241; 375/224

(58) Field of Classification Search
USPC ............... 714/25, 30, 39, 48, 724, 732, 735, 714/738, 742; 370/241; 375/224
See application file for complete search history.

(56) References Cited

U.S. PATENT DOCUMENTS

| | | | | |
|---|---|---|---|---|
| 5,287,523 | A * | 2/1994 | Allison et al. | 710/50 |
| 6,662,313 | B1 * | 12/2003 | Swanson et al. | 714/39 |
| 6,732,311 | B1 * | 5/2004 | Fischer et al. | 714/737 |
| 7,325,164 | B2 * | 1/2008 | Swanson et al. | 714/30 |
| 7,864,790 | B2 * | 1/2011 | Huang | 370/412 |
| 7,944,234 | B2 * | 5/2011 | Lunzer et al. | 326/38 |
| 2006/0184832 | A1 * | 8/2006 | Floyd et al. | 714/45 |

* cited by examiner

*Primary Examiner* — John J Tabone, Jr.
(74) *Attorney, Agent, or Firm* — Trop, Pruner & Hu, P.C.

(57) ABSTRACT

An apparatus for debugging internal signals of integrated circuits is presented. In one embodiment, the apparatus comprises a number of vector registers associated with states of a state machine. A group of registers, associated with a state of the state machine, comprises a mask register an arm register. A comparator compares debug data with contents of the mask register and the arm register to determine a comparison result to be stored in one or more bit positions of the vector register. The apparatus further comprises a triggering logic unit to determine whether or not to trigger a fire event based on the vector registers.

19 Claims, 5 Drawing Sheets

Figure 5

G-ODLAT ON-DIE LOGIC ANALYZER TRIGGER WITH PARALLEL VECTOR FINITE STATE MACHINE

FIELD OF THE INVENTION

Embodiments of the invention relate to debugging and validation of integrated circuits; more particularly, embodiments of the invention relate to the debugging internal signals of the integrated circuits.

BACKGROUND OF THE INVENTION

Advancements in integrated circuit process technology have enabled packing more circuitry or logic into the die space resulting in high integration ICs (integrated circuits). An example of a high integration IC is one in which a memory controller, a graphics processor, and multiple processing cores may be integrated in the same die.

It is a challenging task to debug and to validate a high integration IC because of low observability of internal signals at the external pins of the die. Occasionally, some internal signals can be observed via an interface between the integrated circuit and external peripherals. Such interface provides important hints about the internal signals. This enables performing of root-cause analysis of many failures in the IC. For example, the internal signals may provide an insight into the flow of processor threads and the operation of functional units within a high integration IC. The internal signals may provide failure data of the functional units such as the core area or uncore area of high integration ICs. Availability of such internal signals is useful for performing debug and validation of the high integration ICs.

BRIEF DESCRIPTION OF THE DRAWINGS

Embodiments of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE INVENTION

An apparatus for debugging internal signals of integrated circuits is presented. In one embodiment, the apparatus comprises a number of vector registers associated with states of a state machine. A group of registers, associated with a state of the state machine, comprises a mask register an arm register. A comparator compares debug data with contents of the mask register and the arm register to determine a comparison result to be stored in one or more bit positions of the vector register. The apparatus further comprises a triggering logic unit to determine whether or not to trigger a fire event based on the vector registers. In one embodiment, the apparatus is able to trigger on complex scenarios in an out-of-order distributed protocol that contains several transactions in flight.

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of present invention also relate to apparatuses for performing the operations herein. Some apparatuses may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, DVD-ROMs, and magnetic-optical disks, read-only memories (ROMs), random access memories (RAMs), EPROMs, EEPROMs, NVRAMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, embodiments of the present invention are not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Overview

Figure 1:
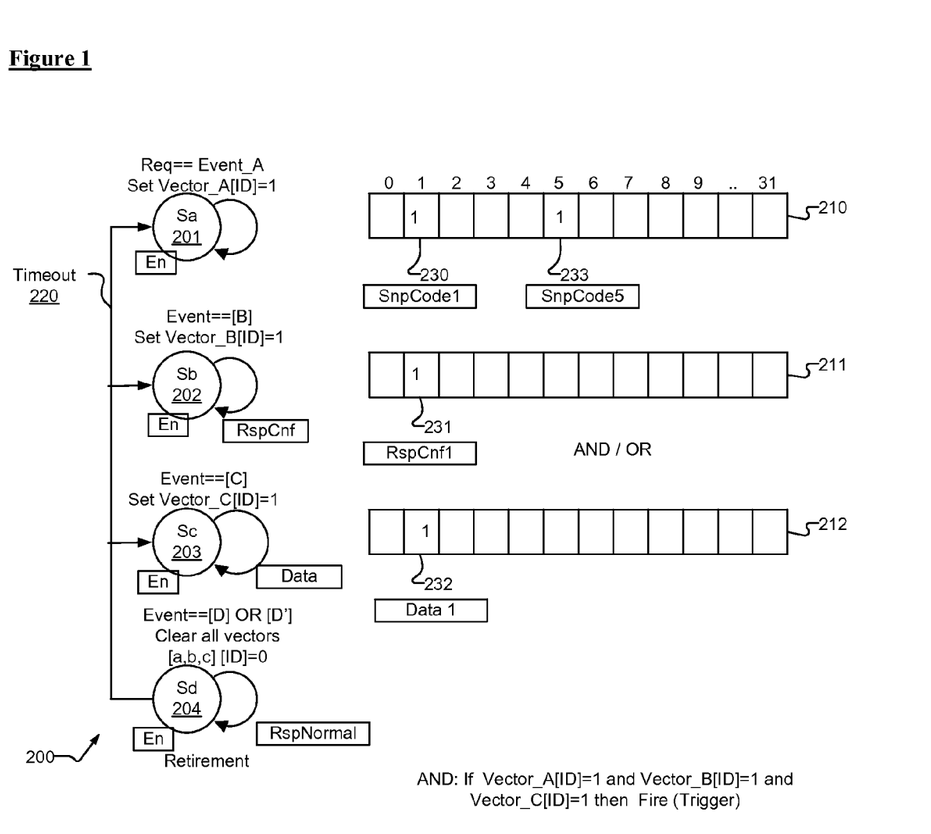
FIG. 1 is a block diagram of a parallel vector finite state machine in accordance with one embodiment of the invention.

FIG. 1 is a block diagram of a parallel vector finite state machine (PVFSM) in accordance with one embodiment of the invention. Referring to FIG. 1, in one embodiment, a PVFSM is an N-state finite state machine (N is larger than 1). Each state is associated with a vector register. PVFSM supports tracking of complicated scenarios and asserts a signal if certain conditions are met.

In one embodiment, a PVFSM is for use with an on-die logic analyzer trigger. The on-die logic analyzer will be described in further detail below with additional references to the remaining figures.

In one embodiment, a "ring" is an out-of-order distributed protocol. In order to optimize performance, the protocol supports several transactions in flight. A ring transaction is assigned with an identifier such that a request, a response, and data completion are associated with each others based on the identifier, even if the events are in a different order. For example, a ring transaction includes a unique RTID (Ring Transaction Identifier) as long as the transaction is in progress. Generic Debug eXternal Connection (GDXC) generates a packet format based on the ring transactions which includes the RTID information. In other embodiments, the PVFSM also supports other protocols (e.g., IDI high speed bus).

In one embodiment, the PVFSM includes state A 201, state B 202, state C 203, and state D 204. The PVFSM further comprises vector registers 210-212. In one embodiment, the vector size (size of a vector register) is a based on the number of RTID (from the Core to System Agent) and the number of CHRTRK (Coherent Tracker) transactions (from System Agent to Core). In one embodiment, for example, the size of a vector register is 32 bits if the number of RTID is 32. In other embodiment, vector registers store the full address if the RTID is reproduced using dynamic methods.

In one embodiment, PVFSM includes timers assigned for each RTID to monitor timeout events. In one embodiment, PVFSM includes parallel comparators (not shown) capable of performing AND/OR operations.

In one embodiment, each state of the PVFSM is associated with a pair of registers (an arm register and a mask register). In one embodiment, contents of the mask register is used to inhibit some of the bit positions in the arm register by using an AND operation.

In one embodiment, a state is programmed to operate in one of the configurations, such as, for example, as a first state, as a retirement state, a state with RTID (uses a vector register), and a state without RTID (detecting a serial event). In one embodiment, the arm/mask registers associated with corresponding states are enabled and are programmed with pattern to detect specific events (packets). In one embodiment, the number of states in operation is configured by enabling or disabling each of the state.

For example, operations described in conjunction with FIG. 1 are to send a trigger in response to a "response conflict", "a snoop request", and specific data write (associated a particular transaction ID). In one embodiment, the arm register and the mask register corresponding to State A 201 are programmed to detect a SnpCode request. The arm register and the mask register corresponding to State B 202 are programmed to detect a RspCnf event. The arm register and the mask register corresponding to State C 203 are programmed to detect a data write event. State D 204 is programmed as a retirement state. Vector register 210 is associated with State A 201. Vector register 211 is associated with State B 202. Vector register 212 is associated with State C 203. The PVFSM is programmed to trigger if bit 1 (bit position 230) of vector register 201 is set, bit 1 (bit position 231) of vector register 211 is set, and bit 1 (bit position 232) of vector register 212 is set. Collectively, the PVFSM is programmed to send a trigger in response to a "snoop request", a "response conflict", and a "data write" events (associated with a particular transaction ID). The above is presented as an example. The scope of coverage of this disclosure is not limited thereto.

In one embodiment, for example, bit 230 of vector register 230 is set in response to SnpCode1. Bit 231 of vector register 211 is set in response to a packet indicating a response conflict event (RTID=1). Bit 233 (bit position 5) of vector register 210 is set in response to SnpCode5. Bit 232 of vector register 212 is set in response to a "data write" event with the transaction ID=1 in a packet. Triggering logic sends out the fire event if bits 230, 231, and 232 are all set.

In one embodiment, vector registers 210-212 are reset in response to debug data indicative of a retirement state (e.g., State D in the above example). For example, if a "Response Normal 1" is received, bit 230, bit 231, and bit 232 will be reset (because they are associated with RTID 1). In one embodiment, if a timeout condition is met (e.g., one or more timers lapse), timeout 220 resets all vector registers 210-212.

Figure 2:
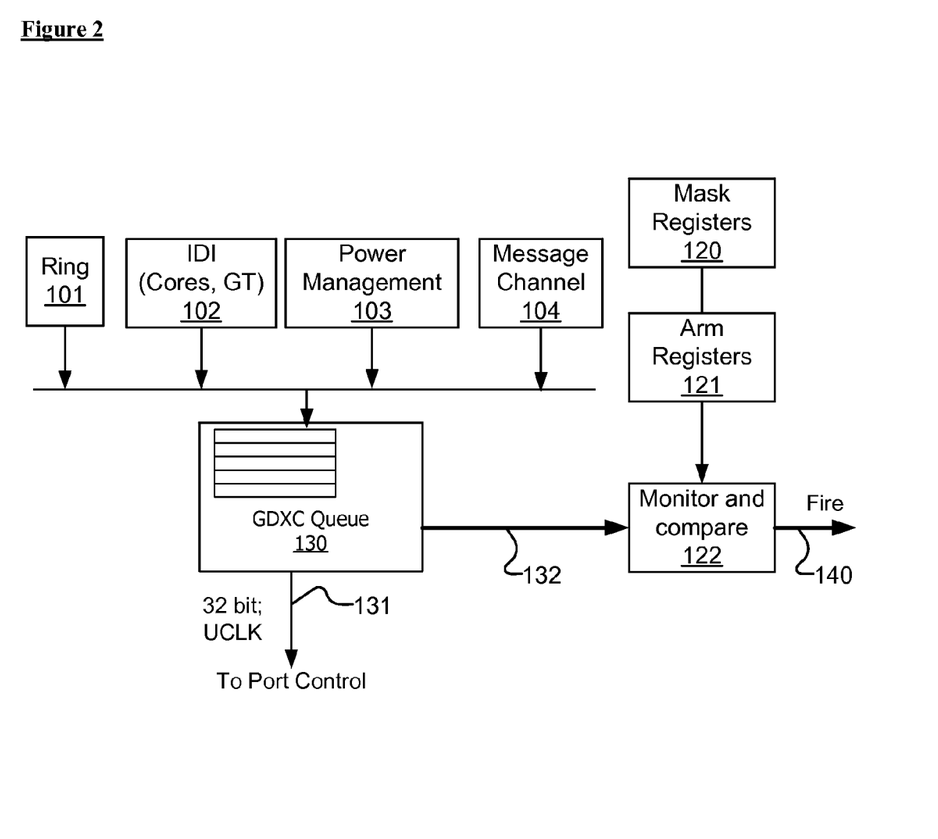
FIG. 2 is a block diagram of on-die logic analyzer trigger in accordance with one embodiment of the invention.

FIG. 2 is a block diagram of on-die logic analyzer trigger in accordance with one embodiment of the invention. Many related components such as buses and peripherals have not been shown to avoid obscuring the invention. Referring to FIG. 2, an embodiment of Generic Debug eXternal Connection (GDXC) is used in conjunction with GDXC On-Die Logic Analyzer Trigger (G-ODLAT). In one embodiment, GDXC includes ring 101, IDI (in-die interface) 102, power management 103, message channel 104, GDXC Queue 130, and port 131. In one embodiment, G-ODLAT includes G-ODLAT input 132, mask registers 120, arm registers 121, monitor and compare 122, and fire 140. In one embodiment, G-ODLAT includes a parallel vector finite state machine which will be described in further detail below with additional references to the remaining figures.

In one embodiment, the aforementioned units are shown as discrete devices. Other embodiments are possible where some or all of these units are integrated within a device or within other devices. In other embodiments, the aforementioned units are distributed throughout a system in hardware, software, or some combination thereof.

Referring to FIG. 2, in one embodiment, GDXC receives and propagates internal information in a packet format to the external world to be used for debug and validation purposes. In one embodiment, G-ODLAT provides good observability and capability for on-die triggering that will support, such as, for example, getting an internal capture.

In one embodiment, GDXC queue 130 observes transactions issued by ring 101, IDI 102, power management 103, and message channel 104. GDXC generates these transaction packets for debug and validation purposes. In one embodiment, ring 101 is an interface implementing a ring protocol to receive event notification in a transactional manner. In one embodiment, IDI 102 is an interface to receive event reporting from one or more processing cores, graphic processors, other processing units, and any combination thereof. In one embodiment, power managements 103 is an interface to receive event reporting associated with power management. In one embodiment, message channel 104 is an interface to receive event reporting in one or more clock frequencies (including different clock domains or a same clock domain).

In one embodiment, an event from ring 101, IDI 102, power management 103, or message channel 104 is reported in the form of a packet. In one embodiment, the structure of the packet includes data fields such as, for example, the type transaction, an identifier of a processing unit (e.g., a processor core, a graphic processor, a hardware thread), a transaction identifier, an address of the transaction, and the main payload (information) of the packet. In one embodiment, GDXC queue 130 receives and stores the packets in one or more queues.

In one embodiment, GDXC queue 130 generates packets to be sent via G-ODLAT input 132 with or without further processing/translation. GDXC also sends signals to port 131. In one embodiment, port 131 is a 32-bit bus operating at a frequency of UCLK.

In one embodiment, arm registers 120 are a set of registers programmable for use to detect particular data patterns. In one embodiment, arm registers 120 are used to store data similar to the structure of a packet so that event detecting is performed based at least on arm registers 120.

In one embodiment, mask registers 121 are a set of registers programmable with mask patterns. In one embodiment, mask registers 121 provides flexibility so that some data fields in a packet are treated as "don't care" in some of the data pattern. For example, some "don't care" fields includes address, time stamps, and thread identifiers.

In one embodiment, G-ODLAT programs contents of arm registers 120 and mask registers 121 to detect one or more dynamic scenarios. A dynamic scenario involves a series of events which is reported via GDXC packets as described. In one embodiment, an event is recorded as a state of the parallel vector finite state machine. In one embodiment, each state of the parallel vector finite state machine is associated with an arm register, a mask register, and a vector register (the state register).

In one embodiment, monitor and compare 122 receives a packet via G-ODLAT input 132. Data in the packet are compared with contents of an arm registers 121 except for some bit positions indicated by mask registers 121. The result of comparison is stored in a vector register. Operations of the parallel vector finite state machine will be described in further detail below with additional references to the remaining figures. In one embodiment, monitor and compare 122 includes one or more comparators or logic operators capable of performing logic operations, but not limited to, including AND operations, OR operations, XOR operations, NOR operations, or combinations thereof.

In one embodiment, monitor and compare 122 includes a triggering logic unit to determine whether or not to trigger fire event 140 based on the plurality of the vector registers (each vector register is associated with a state of the parallel vector finite state machine). For example, the triggering logic unit generates fire event 140 if all the finite state machine conditions are met. In one embodiment, the triggering logic is a part of the parallel vector finite state machine. In one embodiment, G-ODLAT includes fire registers (not shown) programmable to store results for generating output at fire 140 (an output of the G-ODLAT). In one embodiment, an output of fire registers is associated with either a "fire 0" or a "fire 1" status. In one embodiment, fire event 140 causes one or more actions including an internal trigger (alert), a "fire packet", and assertion of external pins.

In one embodiment, a "fire packet" is sent through GDXC port to an external logic. The fire packet is signal to an external logic analyzer to stop the trace. A "fire packet" is used in conjunction with a "combine power" model which will be described in further detail below with additional references to the remaining figures.

In one embodiment, assertion of external pins is performed by sending signals (e.g., a pulse) on one or more these external pins. The signals then trigger external logic, such as, for example, an oscilloscope.

In one embodiment, the structure of a data packet from GDXC queue 130 includes a start bit, a packet size, an overflow bit, a time stamp, a wrap bit, a type data, and a ring transaction identifier (RTID).

In one embodiment, the start bit is indicative of whether the packet is a continuation of a previous packet of a new packet itself. The packet size is, for example, one of the following values: 32, 64, 96, or 128 bits. In one embodiment, an overflow bit is set after GDXC has dropped some packets because of the overflow at GDXC queue 130. In one embodiment, the overflow bit is set for the first packet after the overflow and the bit is cleared in the next packet. In one embodiment, a time stamp is a 7-bit data field. The time stamp enables external tools to determine events in a chronological order. The packets are produced and propagated in different parts of a chip. As a result, these packets reach an external logic analyzer in an out-of-order manner. A time stamp is generated at the event source so that the time stamp is correlated with the timing of the actual event.

In one embodiment, the wrap bit is set on the first packet after a wraparound event happens in one or more queues in GDXC queue 130. Wraparound occurs when elapsed time exceeds the 128 UCLK resolution of the time stamp. This bit is for post processing software to layout long latency packets on the same time scale.

In one embodiment, the type data field indicates the format of the packet. For example, a logic analyzer or post processing software determines the length of a packet, data fields, and corresponding bit positions thereof. In one embodiment, a ring transaction identifier (RTID) is used to correlate ring-based packets with other events related to the same transaction (i.e., Request, Data, Acknowledge, and Response).

In one embodiment, the parallel vector finite state machine includes eight sets of arm/mask registers if the data packet is 64 bits in length. In one embodiment, the finite state machine includes four sets of arm/mask registers if the data packet is 128 bits in length. It will be appreciated by those skilled in the art that these values may be larger or smaller for different designs. In one embodiment, a Wrap packet is for use to implement the time stamp flow. In other embodiments, other methods are applied for reconstructing the time stamp.

In one embodiment, G-ODLAT operates in parallel to GDXC which does not affect GDXC operation. In one embodiment, G-ODLAT uses packets from GDXC queue logic 130 and does not require input and output data flow with external world (outside of the integrated circuit). In such operations, G-ODLAT runs at a higher speed than the I/O bandwidth of GDXC. In one embodiment, G-ODLAT operates at a frequency faster than the frequency of an external logic analyzer. G-ODLAT is able to operate in conjunction with external logic analyzer (LA) by generating "fire packet" as an indication to the LA that G-ODLAT has met the trigger conditions. This mode of operation is referred to herein as "combine power".

In one embodiment, G-ODLAT supports detecting sequential events or a combination of sequential and parallel events. In one embodiment, G-ODLAT supports detecting a combination of sequential events, for example, from power management 103 and ring 101. In one embodiment, G-ODLAT supports timeout events and operations in conjunction with in-order protocols.

While the embodiments are discussed in reference to GDXC, the techniques are also applicable to other techniques, for example, using one of the DDR channels to send the output to external logic.

Figure 3:
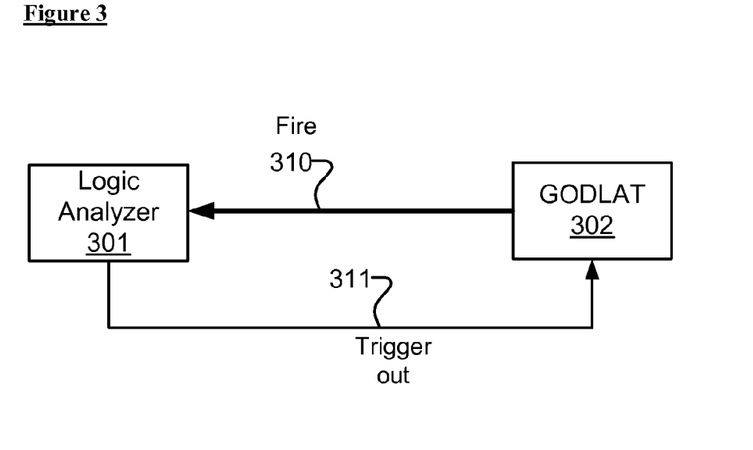
FIG. 3 shows debug logic to captures internal signals before providing the internal signals to the external tools according to one embodiment of the invention.

FIG. 3 shows debug logic to captures internal signals before providing the internal signals to the external tools according to one embodiment of the invention. Referring to FIG. 3, in one embodiment, the system comprises G-ODLAT 302 and logic analyzer 301. In one embodiment, logic analyzer 301 is an external logic analyzer. In one embodiment, this mode of operation is referred to herein as a "combine power" mode.

In one embodiment, for example, logic analyzer 301 is set to trigger on power management slow sequential events. When some conditions are met, logic analyzer 301 sends a pulse via trigger 311. Trigger 311 is coupled to debug and validate (DV) pins of G-ODLAT 302. G-ODLAT 302 switches from a standby mode and begins to monitor ring events in response to the assertion of DV pins. Logic analyzer 301 enters a standby mode but continues to receive and to store GDXC packets as usual.

In one embodiment, G-ODLAT 302 sends fire packet 310 if conditions that G-ODLAT 302 is programmed to detect are met. Logic analyzer 301 detects a fire packet which indicates that the trigger conditions are met. Logic analyzer 301 stops storing GDXC packets.

Figure 4:
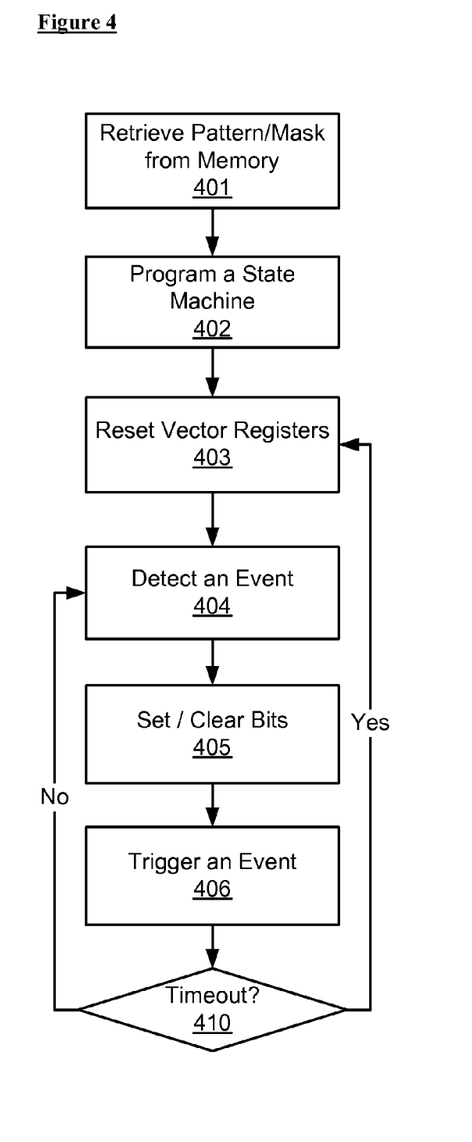
FIG. 4 is a flow diagram of one embodiment of a process for configuring and using a parallel vector finite state machine.

FIG. 4 is a flow diagram of one embodiment of a process for configuring and using a parallel vector finite state machine. The process is performed by processing logic that may comprise hardware (circuitry, dedicated logic, etc.), software (such as one that is run on a general purpose computer system or a dedicated machine), or a combination of both. In one embodiment, the process is performed in conjunction with an apparatus (e.g., G-ODLAT with respect to FIG. 2). Referring to FIG. 4, in one embodiment, processing logic begin by retrieving data from memory to program arm registers and mask registers (process block 401).

In one embodiment, processing logic programs arm registers and mask registers associated with states of a parallel vector finite states machine (PVFSM) based on the pattern data retrieved from memory (process block 402). Processing logic resets vector registers (process block 403). Each register is associated with a state of the PVFSM.

In one embodiment, processing logic detects events based on debug information received (process block 404). Processing logic sets or clears bits in the vector registers in response to different packets containing debug information (process block 405). Processing logic performs comparisons on the debug data and contents of arm registers except on the bit positions indicated in corresponding mask registers. Processing logic performs the comparisons for different states of the PVFSM (different sets of arm/mask registers) in parallel.

In one embodiment, processing logic triggers an event, such as, for example, sends a fire packet to external logic if the conditions which it is programmed to detect are met (process block 406).

In one embodiment, processing logic determines whether or not a timeout has occurred (process block 410). If the timeout condition is met, processing logic resets all vector registers and begins the monitoring process again. Otherwise, processing logic continues to monitor events until the conditions are met. Processing logic resets all vector registers in response to some events which indicative of a retirement state. In one embodiment, if the timeout condition does not exist, processing logic continues to monitor events until the conditions are met.

Embodiments of the invention may be implemented in a variety of electronic devices and logic circuits. Furthermore, devices or circuits that include embodiments of the invention may be included within a variety of computer systems. Embodiments of the invention may also be included in other computer system topologies and architectures.

Figure 5:
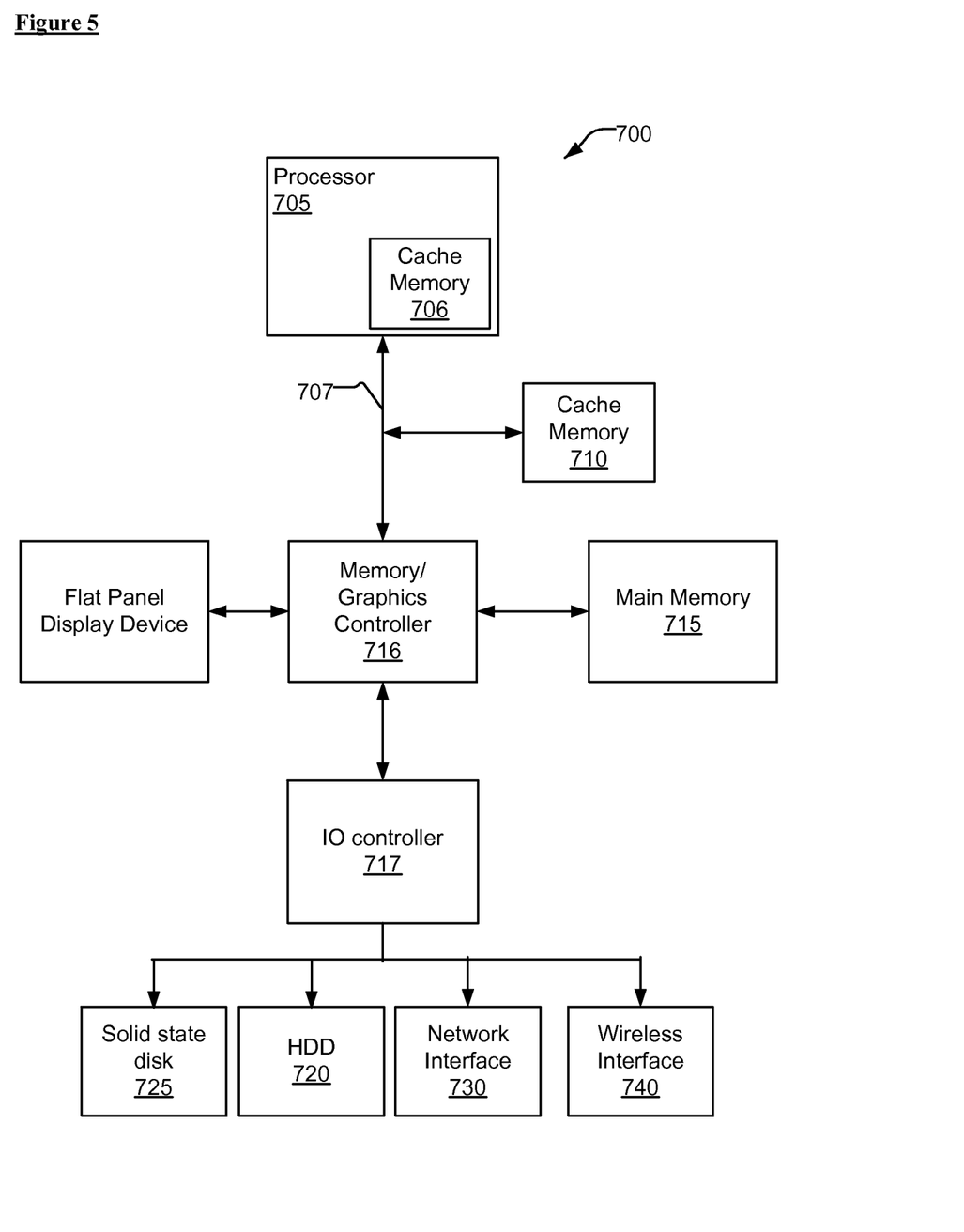
FIG. 5 illustrates a computer system for use with one embodiment of the present invention.

FIG. 5, for example, illustrates a computer system in conjunction with one embodiment of the invention. Processor 705 accesses data from level 1 (L1) cache memory 706, level 2 (L2) cache memory 710, and main memory 715. In other embodiments of the invention, cache memory 706 may be a multi-level cache memory comprise of an L1 cache together with other memory such as an L2 cache within a computer system memory hierarchy and cache memory 710 are the subsequent lower level cache memory such as an L3 cache or more multi-level cache. Furthermore, in other embodiments, the computer system may have cache memory 710 as a shared cache for more than one processor core.

Processor 705 may have any number of processing cores. Other embodiments of the invention, however, may be implemented within other devices within the system or distributed throughout the system in hardware, software, or some combination thereof.

Main memory 715 may be implemented in various memory sources, such as dynamic random-access memory (DRAM), hard disk drive (HDD) 720, solid state disk 725 based on NVRAM technology, or a memory source located remotely from the computer system via network interface 730 or via wireless interface 740 containing various storage devices and technologies. The cache memory may be located either within the processor or in close proximity to the processor, such as on the processor's local bus 707. Furthermore, the cache memory may contain relatively fast memory cells, such as a six-transistor (6T) cell, or other memory cell of approximately equal or faster access speed.

Other embodiments of the invention, however, may exist in other circuits, logic units, or devices within the system of FIG. 5. Furthermore, in other embodiments of the invention may be distributed throughout several circuits, logic units, or devices illustrated in FIG. 5.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chipset components, programmable logic arrays (PLA), memory chips, network chips, or the like. Moreover, it should be appreciated that exemplary sizes/models/values/ranges may have been given, although embodiments of the present invention are not limited to the same. As manufacturing techniques (e.g., photolithography) mature over time, it is expected that devices of smaller size could be manufactured.

Whereas many alterations and modifications of the embodiment of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

The invention claimed is:

1. An apparatus comprising:
a plurality of vector registers, each associated with a state of a state machine, including a first vector register associated with a first state of the state machine, wherein each bit is set in response to a code, a request, or an event associated with a transaction identifier;
a first group of registers, associated with the first state, comprising a first mask register and a first arm register, wherein contents of the first mask register are used to inhibit some bit positions in the first arm register, wherein the first mask register and the first arm register are programmed to detect a first request or a first event;
a plurality of comparators comprising a first comparator to compare first debug data with contents of the first mask register and the first arm register to determine a comparison result to be stored in one or more bits of the first vector register; and
a triggering logic unit to determine whether or not to trigger a fire event based at least on the comparison result stored in the one or more bits of the first vector register and a corresponding comparison result stored in one or more corresponding bits of others of the plurality of vector registers.

2. The apparatus of claim 1, wherein the comparator is to perform a logical AND operation on the first debug data and the first arm register except on one or more bit positions in accordance with content of the first mask register.

3. The apparatus of claim 1, further comprising a plurality of groups of registers comprising the first group of registers, each group is associated with a state of the state machine and comprising a mask register and an arm register.

4. The apparatus of claim 1, wherein content of the first mask register is indicative of, at least, whether or not to compare the first debug data and the first arm register with respect to a bit position.

5. The apparatus of claim 1, wherein content of the first mask register is indicative of whether or not to inhibit a bit position of the first arm register so that no comparison is required with respect to the bit position.

6. The apparatus of claim 1, further comprising a controller to reset a plurality of bit positions of the plurality of vector registers if the first debug data are indicative of a retirement state, wherein the plurality of bit positions are associated with a transaction identifier.

7. The apparatus of claim 1, wherein the first comparator is operable to receive the first debug data in a packet from a packet queue.

8. The apparatus of claim 1, further comprising a plurality of timers including a first timer to trigger a time-out event.

9. The apparatus of claim 1, wherein the first comparator is operable to perform logical operations including a logical AND operation and a logical OR operation.

10. The apparatus of claim 1, further comprising a port operable to send, in response to the fire event, debug information to external logic, the fire event responsive to detection of a snoop code, a response conflict event, and a data write event associated with a first transaction identifier.

11. The apparatus of claim 1, wherein a number of bits within the first vector register is based at least on a number of transaction identifiers.

12. A method claim comprising:
retrieving, from a memory, a first pattern and first indications about one or more bit positions;
performing, except on the one or more bit positions, a comparison on first debug data and the first pattern;
storing a result of the comparison in a first vector register; and
determining whether to trigger an event based at least on a comparison result stored in a plurality of vector registers including the first vector register, the event responsive to detection of a snoop code, a response conflict event, and a data write event associated with a first transaction identifier.

13. The method of claim 12, further comprising storing the first pattern and the first indications in a group of registers associated with a first state of a finite state machine, wherein the group of registers comprises a first arm register and a first mask register.

14. The method of claim 13, wherein the finite state machine is operable as a parallel finite state machine and a serial finite state machine based at least on configuration data from the memory.

15. The method of claim 12, further comprising:
performing, in parallel with the first comparison, a second comparison between a second pattern and second debug data; and
storing a result of the second comparison in a second vector register, wherein the first debug data and the second debug data are associated with different events.

16. The method of claim 12, further comprising sending debug information to external logic if the event is triggered.

17. The method of claim 12, wherein the comparison comprises performing a logical AND operation, a logical OR operation, or both.

18. A system comprising:
a plurality of processing cores;
a first debug module to capture signals that occur between the plurality of processing cores and to generate a packet regarding first debug data based on the signals; and
a second debug module, coupled to receive the packet, comprising a plurality of vector registers, each associated with a state of a state machine, including a first vector register associated with a first state of the state machine;
a first group of registers, associated with the first state, comprising a first mask register and a first arm register;
a plurality of comparators comprising a first comparator to compare the first debug data with contents of the first mask register and the first arm register to determine a comparison result to be stored in one or more bits of the first vector register; and
a triggering logic unit to determine whether or not to trigger a fire event based at least on a comparison result stored in the plurality of the vector registers, the fire event responsive to detection of a snoop code, a response conflict, and a data write event associated with a first transaction identifier.

19. The system of claim 18, further comprising a plurality of groups of registers comprising the first group of registers, each group is associated with a state of the state machine.

* * * * *